United States Patent [19]

Canavello et al.

[11] 4,086,870

[45] May 2, 1978

[54] NOVEL RESIST SPINNING HEAD

[75] Inventors: Benjamin John Canavello, Stony Point; Michael Hatzakis, Ossining; Arthur Richard Siegel; Connell Watters, both of Yorktown Heights, all of N.Y.

[73] Assignee: International Business Machines Corporation, Armonk, N.Y.

[21] Appl. No.: 811,732

[22] Filed: Jun. 30, 1977

[51] Int. Cl.² .............................................. B05C 11/08
[52] U.S. Cl. ...................................... 118/52; 118/503
[58] Field of Search .................................. 118/52–56; 427/2, 4, 72, 231–234, 240, 241, 346, 347; 34/8, 58; 233/1 R; 23/230 B, 258.5; 269/57, 321 WE

[56] References Cited

U.S. PATENT DOCUMENTS

| 2,021,485 | 11/1935 | Huebner | 427/240 X |
| 3,906,890 | 9/1975 | Amos et al. | 427/2 X |

Primary Examiner—Morris Kaplan
Attorney, Agent, or Firm—Philip Young

[57] ABSTRACT

A resist spinning head for preventing photoresist, or electron and X-ray resist from flowing to the edge of the wafer when spin coating in a photoresist spinner, which includes the use of a tapered top plate having a knife-edge contact to the surface of the wafer so as to seal the top of the wafer at an outer ring and prevent resist from flowing under the top plate; whereby the resist is guided, during spinning, by the tapered top surface to the edge of the plate and off the head. The tapered top plate is pressed against the wafer and secured by a spring biasing means to a spinner motor shaft.

12 Claims, 6 Drawing Figures

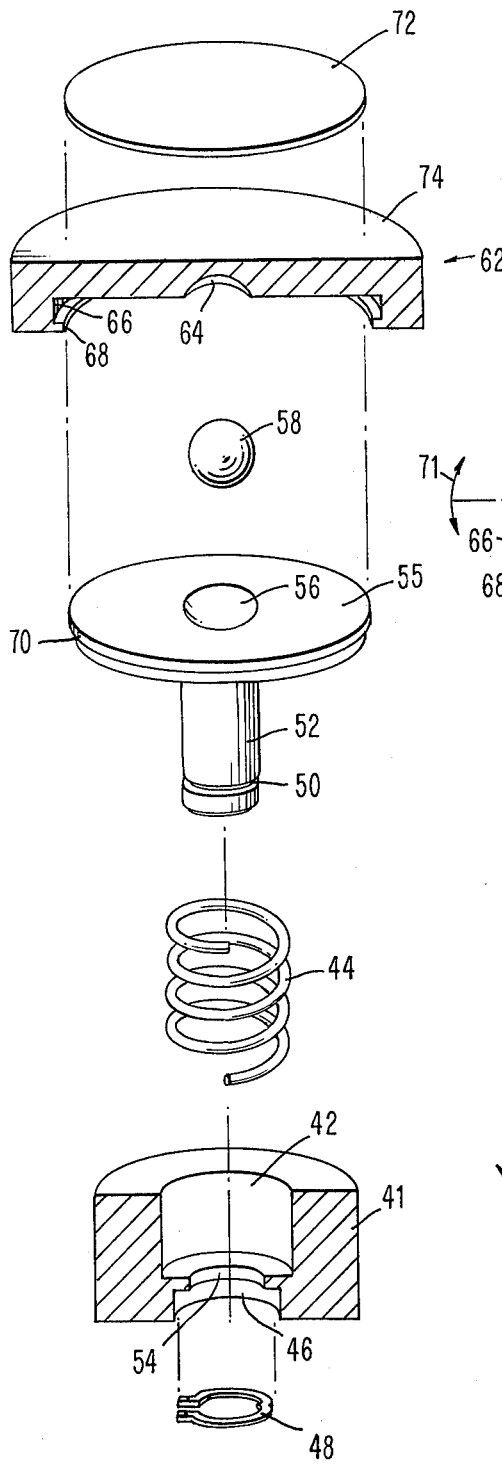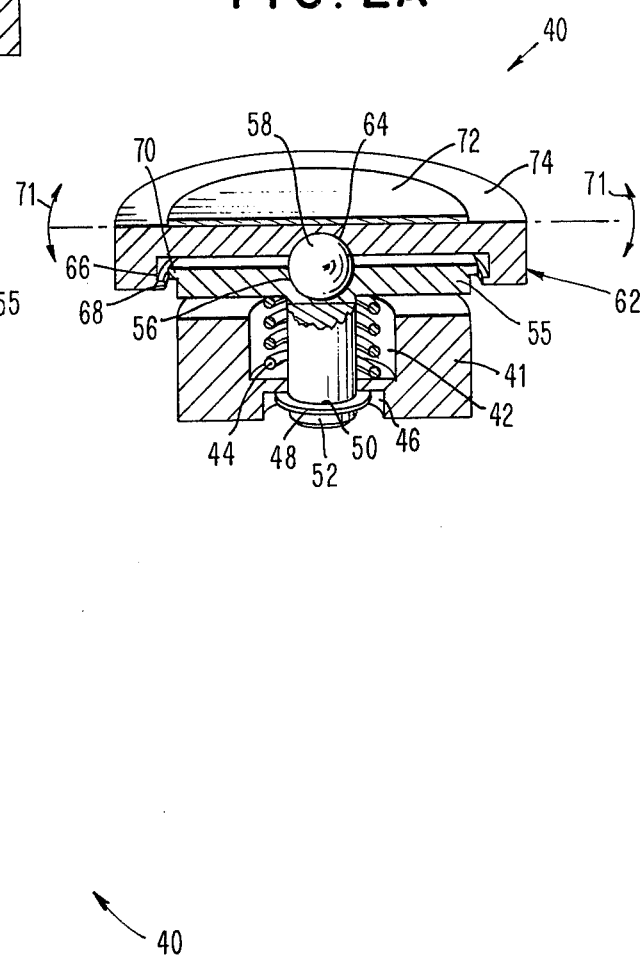

NOVEL RESIST SPINNING HEAD

BACKGROUND OF THE INVENTION

The present invention relates to wafer holding spinner chucks, and more particularly to a chuck for holding wafers during resist coating.

DESCRIPTION OF THE PRIOR ART

In a conventional technique employed in processing wafers for electroplating, after resist spinning and baking the samples are exposed in an ultraviolet system to clear a ring around the edge of the wafer. After development, the resist is removed and the ring is used to make electrical contact to the thin metal base film for electroplating. This process introduces an additional exposure and development step to device fabrication where the outer ring is required around the active central area of the wafer. In addition, one problem associated with resist coating is that of resist build-up at the edge of the wafer, especially when casting films from thick resist solutions.

SUMMARY OF THE INVENTION

It is an object of the present invention to perform resist coating on a wafer with the outer ring of the wafer clean, providing an electrical contact for plating purposes and elimination of edge build-up in thick resist layers, without requiring an extra development and exposure step for the wafer ring.

It is another object to perform resist coating on a wafer while preventing resist flow onto the outer ring of the wafer.

It is another object to eliminate certain processing steps in thin film device technology and increase the accuracy of the alignment process.

These and other objects are achieved by the present invention which provides a resist spinning head for preventing photoresist, or electron and x-ray resist, from flowing to the edge of the wafer when spin coating in a photoresist spinner, and includes the use of a tapered top plate having a knife-edge contact to the surface of the wafer so as to seal the top of the wafer and prevent resist from flowing under the top plate; whereby the resist is guided, during spinning, by the tapered top surface to the edge of the plate and off the head.

The resist spinning head eliminates the need to expose the edge of wafers, intended for electroplating or electron beam exposure, so as to remove resist to enable electrical contact to be made to a base plating metal layer.

The resist spinning head includes a platform which is mounted on a ball swivel joint that connects to the spinner base and spinner motor shaft. The ball swivel joint provides accurate alignment of the top wafer surface perpendicular to the motor shaft.

BRIEF DESCRIPTION OF THE DRAWINGS

FIG. 2A shows a spring mount and ball support subassembly including the wafer platform, and FIG. 2B is an exploded view of such subassembly;

DESCRIPTION OF THE PREFERRED EMBODIMENTS

Figure 1A:
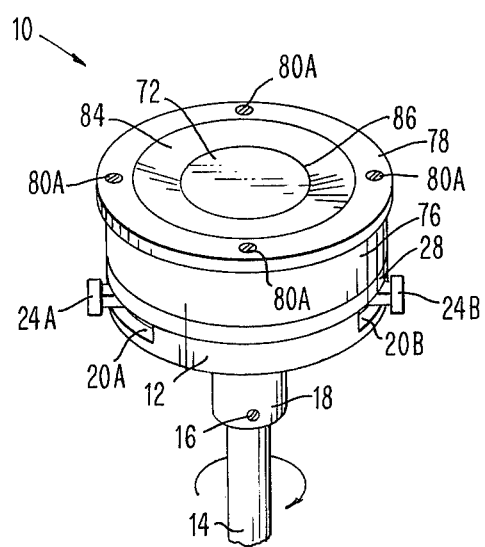
FIG. 1A is an assembled view of the wafer spinner chuck, illustrative of the present invention.
Figure 1B:
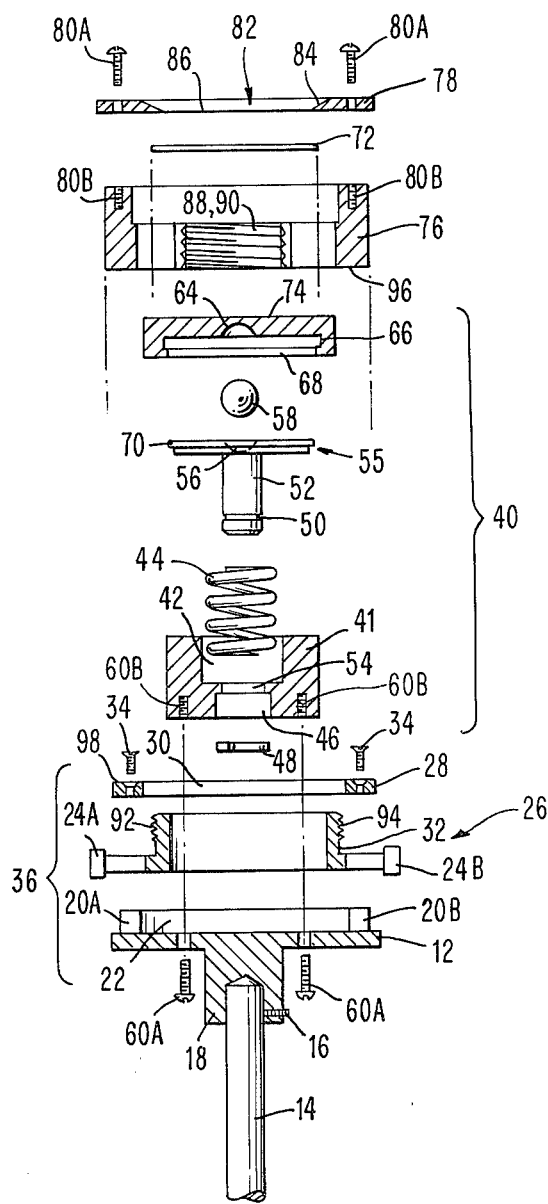
FIG. 1B is a sectional view of the wafer spinner chuck shown in 1A.

Referring to FIGS. 1A, and 1B, a wafer spinner chuck 10 includes a base 12 adapted to be attached to a spinner motor shaft 14, by a set screw 16 which holds the motor shaft 14 in place in the hub 18 of base 12.

Base 12 has a notched portion 20A and 20B on opposite sides of the raised shoulder portion 22 such that the arms 24a and 24b of a bayonet lock ring 26 cooperate in the respective notched portions 20A and 20B. A retainer ring 28 has a central opening 30 for accommodating the central portion 32 of the lock ring 26. During assembly, the retainer ring 28 is attached, such as by screw means 34, to the base 12 with the lock ring 26 interposed between such members 12 and 28 and the bayonet arms 24a and 24b extending through the slots formed by the notches 20a and 20b and the retainer ring 28. The base 12, ring 26 and retainer ring 28 continue to form a bayonet lock ring assembly 36.

A spring mount and ball support subassembly 40 shown in further detail in FIGS. 2A and 2B includes a spring mounting cylinder 41 having a first recess 42 for retaining a spring 44, and a second recess 46 for accommodating a retainer ring lock 48 which embraces a groove 50 of a ball support shaft 52 that passes through spring 44, recess 42, an interconnecting passage 54, and into clearance recess 46 for retainer ring 48 installation. Passage 54 has a smaller diameter relative to the recesses 42 and 46 to secure the ball support shaft 52 such that the latter is spring loaded when secured by retainer ring 48. Attached to the ball support shaft 52 is a ball support platform 55 having a circular detent 56 for receiving a ball 58.

The spring mount and ball support subassembly 40 is connected to the base 12 by screws 60A and threaded holes 60B in the spring mounting cylinder 41. A wafer platform 62 is coupled to the ball support platform 55 via the ball 58 which rides in both its detent 56 and a matching detent 64 in the underside of wafer platform 62 as shown. The wafer platform 62 has a circular internal recess 66 at its underside with a shoulder 68 for receiving and retaining a rim 70 on the outer diameter of the ball support platform 55. The height of recess 66 is greater than the height of the rim 70 to permit a swivel action of wafer platform 62 relative to the ball support platform 55 as indicated by arrows 71 in FIG. 2A.

A wafer 72 is placed on the smooth polished surface 74 of the wafer platform 62. The spring mount and ball support subassembly 40 permits the wafer platform 62 to swivel and compress downward so that the knife-edge ring can conform to irregularities in the wafer surface, thus creating a seal, and accommodating wafers of various thicknesses. Also, the spring mount and ball support subassembly maintains an alignment of the top wafer surface perpendicular to the spinning axis. The wafer 72 is held down by a ring spinner top 76 on which an interchangeable top plate 78 is mounted, such as by screw means 80A and 80B. The hole 82 in the center of this top plate 78 determines the area of the wafer 72 on which resist will be coated. One feature of the wafer spinner chuck is that the inner edge of the top plate 78 is tapered as shown at 84 on the top side to a knife edge 86 which seals the top of the wafer and does not allow any resist to flow under the plate. Instead, the resist is guided, during spinning by the tapered top surface 84 to the edge of the plate and off the head.

Figure 3:
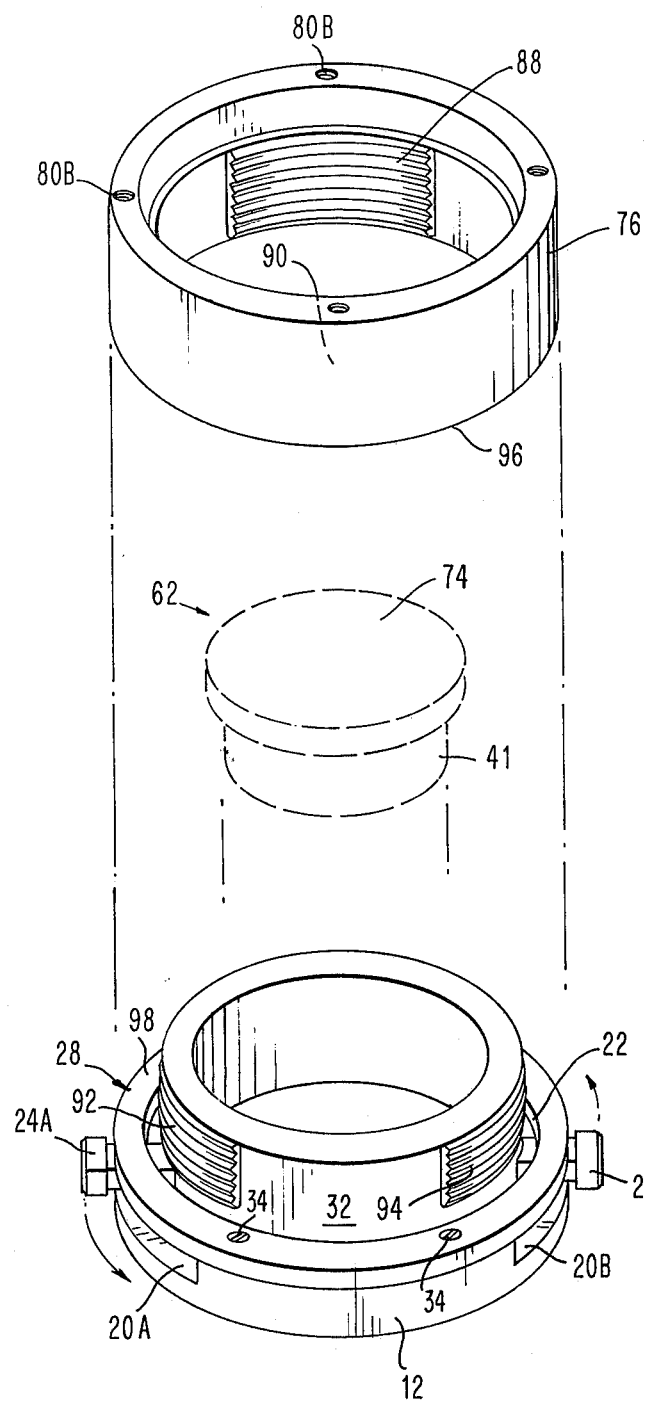
FIG. 3 shows the assembly of a ring spinner top with a bayonet lock ring assembly.

The manner of locking the ring spinner top 76 into the bayonet and lock ring assembly 36 is shown in FIG. 3. Here, the ring spinner top 76 includes internal locking grooves or thread sectors 88 and 90 which respectively slide into and lock onto a pair of mating thread sectors 92 and 94 formed on the central portion 32 of the lock ring 26. The spinner top 76 is locked onto the base 12 via the bayonet and lock ring 26 by pressing the spinner top 76 down to compress the subassembly 40 through its spring 44 so the bottom surface 96 of spinner top 76 hits flush with the top surface 98 of the retainer ring 28. The bayonet and lock ring 26 is rotated by arms 24a and 24b, about ¼ turn, to cause the spinner top threads 88 and 90 to engage with the lock ring threads 92 and 94. This action locks together the entire assembly with the wafer 72 compressed by the top 78 onto the wafer platform surface 74.

Figure 4:
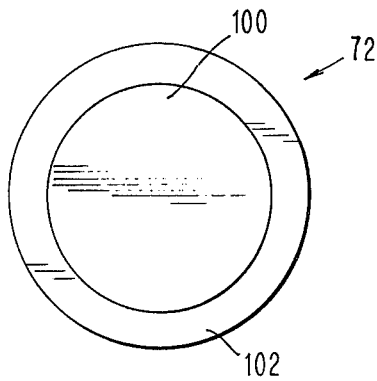
FIG. 4 shows a plan view of a wafer after resist coating with the spinning head of the present invention.

The interchangeable top plate 78 allows the coating of different diameter wafers or different widths of the edge ring. It also allows for certain areas on the edge of the wafer, such as areas containing registration marks, to be protected from resist coating. This increases the signal-to-noise ratio obtained by electronically or optically scanning these marks during registration and therefore allows for more accurate positioning of the wafer with respect to the electron beam or optical mark before writing the pattern. After drying the resist, the spinner top is removed and the wafer is ready for the next processing step. FIG. 4 shows the wafer 72 having the resist coated on the central portion 100 while the protected ring edge portion 102 is free of resist and, therefore, can be used directly as an electrical ground for the wafer top surface during election beam exposure, electroplating, or more accurate registration if registration marks are contained within ring edge portion 102.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A resist spinning head for supporting a wafer when spin coating onto the wafer surface, comprising:
    spinning head base support means for attachment to a spinner motor shaft;
    a wafer platform adapted for mounting on said spinning head base support means;
    wafer hold down means for maintaining said wafer on said wafer platform, said wafer hold down means including a tapered top plate having an opening through which a resist is applied onto the wafer surface, said tapered top plate being tapered in an axial direction leading into a knife-edge contact to the surface of the wafer around said opening so as to seal the top of said wafer and prevent resist from flowing under said top plate;
    whereby the resist is guided by the tapered top surface during spinning to the outer edge of said top plate and off the spinning head.

2. Apparatus as recited in claim 1 wherein said top plate has a generally flat ring configuration with the upper surface of said top plate tapering downward towards the ring opening at the wafer surface.

3. Apparatus as recited in claim 1 wherein said top plate is interchangeable with other top plates in said wafer hold down means to permit spin coating on different sizes and shapes of wafers.

4. Apparatus as recited in claim 1 wherein said wafer hold down means includes a bayonet lock ring assembly having a bayonet lock ring which is adapted for a limited rotatable movement within a housing base member, said housing base member being attached to said spinner motor shaft; and said wafer hold down means also including a ring spinner top on which said top plate is mounted, said ring spinner top and said bayonet lock ring having cooperative locking means for locking said parts together upon a rotative movement of said bayonet lock ring.

5. Apparatus as recited in claim 4 wherein said top plate is attached to said ring spinner top to press said wafer against said wafer platform.

6. Apparatus as recited in claim 5 further comprising a spring mount and ball support subassembly interposed between said ring spinner top and said bayonet housing member, and including a ball joint between the wafer platform and a ball support along a central ball support shaft, said ball support shaft being flexibly attached via spring means to the bayonet housing attached to the spinner motor shaft so that said wafer platform is swivably mounted with respect to said ball support shaft and said wafer platform is attached to the spinner motor shaft via a spring mounting so that said wafer platform can swivel and be compressed downward to permit wafers of various thicknesses as well as alignment of the top wafer surface perpendicular to the spinning axis.

7. A resist spinning head for preventing the resist from flowing to the edge of the wafer when spin coating on a resist spinner, comprising:
    a spinning head base for attachment to a spinner motor shaft;
    wafer platform means for supporting the wafer thereon, said wafer platform means including a platform which is flexibly mounted with respect to said spinning head base;
    wafer hold down means for maintaining said wafer on said wafer platform and including a top plate adapted for connection to said wafer platform means with said wafer interposed between said top plate and said wafer platform, said top plate having a central opening that determines the area of the wafer on which resist will be coated, the inner edge of the top plate being tapered in an axial direction on the top side to a knife-like edge which seals the top of the wafer around said central opening so that resist cannot flow under the plate, whereby the resist is guided, during spinning, by the tapered top surface, to the edge of the plate and off the head.

8. Apparatus as recited in claim 7, wherein said wafer platform means includes a spring mounting between said wafer platform and said spinning head base, whereby said top plate can compress the wafer platform downward with said wafer maintained in a tight pressfit against the top plate.

9. Apparatus as recited in claim 8, wherein said wafer platform means includes a ball swivel joint between said wafer platform and said spinning head base, whereby said wafer platform can swivel and be compressed downward to permit wafers of various thicknesses as well as alignment of the top wafer surface perpendicular to the spinning axis.

10. Apparatus as recited in claim 7, wherein said wafer platform means is adapted to be connected to interchangeable top plates of different sizes and shapes.

11. Apparatus as recited in claim 7, wherein said wafer hold down means includes a ring spinner top adapted to be secured to said spinning head base, said top plate being attached to said ring spinner top to press said wafer against said wafer platform to permit spin coating on different sizes and shapes of wafers.

12. Apparatus as recited in claim 7, wherein said wafer hold down means includes a bayonet lock ring assembly having a bayonet lock ring which is adapted for a limited rotatable movement within a housing base member, said housing base member being attached to said spinner motor shaft; and said wafer hold down means also including a ring spinner top on which said top plate is mounted, said ring spinner top and said bayonet lock ring having cooperative locking means for locking said parts together upon a rotative movement of said bayonet lock ring.

* * * * *